(12) United States Patent
Baccini et al.

(10) Patent No.: US 9,722,118 B2
(45) Date of Patent: Aug. 1, 2017

(54) APPLICATION OF THE ENCAPSULANT TO A BACK-CONTACT BACK-SHEET

(71) Applicant: EBFOIL S.R.L., Bologna (IT)

(72) Inventors: Elisa Baccini, Carbonera (IT); Luigi Marras, Medea (IT); Bruno Bucci, Castenaso (IT)

(73) Assignee: EBFOIL S.R.L., Bologna (IT)

( * ) Notice: Subject to any disclaimer, the term of this patent is extended or adjusted under 35 U.S.C. 154(b) by 0 days.

(21) Appl. No.: 14/650,569

(22) PCT Filed: Dec. 11, 2013

(86) PCT No.: PCT/IB2013/060816
§ 371 (c)(1),
(2) Date: Jun. 8, 2015

(87) PCT Pub. No.: WO2014/091427
PCT Pub. Date: Jun. 19, 2014

(65) Prior Publication Data
US 2015/0333204 A1    Nov. 19, 2015

(30) Foreign Application Priority Data

Dec. 11, 2012 (IT) .............................. VI2012A0333

(51) Int. Cl.
*H01L 21/00* (2006.01)
*H01L 31/049* (2014.01)
(Continued)

(52) U.S. Cl.
CPC .......... *H01L 31/049* (2014.12); *B32B 37/142* (2013.01); *H01L 31/0516* (2013.01);
(Continued)

(58) Field of Classification Search
CPC ......................... Y02E 10/50; Y02E 27/14618
(Continued)

(56) References Cited

U.S. PATENT DOCUMENTS

2005/0279401 A1* 12/2005 Arhart ............... B32B 17/10743
136/251
2007/0012352 A1* 1/2007 Wohlgemuth .... B32B 17/10018
136/251

(Continued)

FOREIGN PATENT DOCUMENTS

JP   2011199020    10/2011
WO  WO 2008/080160   7/2008
(Continued)

OTHER PUBLICATIONS

De Jong, "Single-step Laminated Full-size PV Modules Made with Back-contacted MC-SI Cells and Conductive Adhesives", Jun. 17, 2004, pp. 1-4.
(Continued)

*Primary Examiner* — Jami M Valentine
(74) *Attorney, Agent, or Firm* — Fattibene and Fattibene LLC; Paul A. Fattibene (57) ABSTRACT

A method for the production of a photovoltaic module comprising back-contact solar cells. A lower encapsulating layer, followed by an alignment and an application of the lower encapsulating layer to the inner surface of the back-contact back-sheet. The lower encapsulating layer, comprises a lower surface facing the back-contact back-sheet and an upper surface opposite the lower surface. The method includes adhesion of one or more predetermined portions of the lower surface of the encapsulating layer to the back-contact back-sheet, having each portion a predetermined superficial area which is lower than the total area of the lower surface of the lower encapsulating layer. The adhesion of the lower encapsulating layer is followed by the application of the lower encapsulating layer to the back-contact back-sheet.

18 Claims, 5 Drawing Sheets

(51) Int. Cl.
*B32B 37/14* (2006.01)
*H01L 31/05* (2014.01)
*H01L 31/18* (2006.01)
*B32B 37/10* (2006.01)

(52) U.S. Cl.
CPC ...... *H01L 31/1876* (2013.01); *B32B 37/1009* (2013.01); *B32B 2309/105* (2013.01); *B32B 2457/12* (2013.01); *Y02E 10/50* (2013.01); *Y02P 70/521* (2015.11)

(58) Field of Classification Search
USPC .......................................................... 438/66
See application file for complete search history.

(56) References Cited

U.S. PATENT DOCUMENTS

| | | | |
|---|---|---|---|
| 2010/0012172 A1* | 1/2010 | Meakin | H01L 31/048 136/251 |
| 2010/0024881 A1 | 2/2010 | Hacke et al. | 136/256 |
| 2011/0067751 A1* | 3/2011 | Meakin | H01L 31/048 136/251 |
| 2011/0083716 A1* | 4/2011 | Meakin | H01L 31/048 136/244 |
| 2011/0126878 A1 | 6/2011 | Hacke et al. | 136/244 |
| 2012/0204938 A1 | 8/2012 | Hacke et al. | 136/246 |
| 2012/0312358 A1 | 12/2012 | Yamashita et al. | 136/251 |
| 2015/0144180 A1* | 5/2015 | Baccini | H01L 31/049 136/251 |
| 2015/0236181 A1* | 8/2015 | Baccini | H01L 31/049 136/256 |
| 2015/0280039 A1* | 10/2015 | Baccini | H01L 31/0203 438/66 |

FOREIGN PATENT DOCUMENTS

| | | |
|---|---|---|
| WO | WO 2011/105510 | 9/2011 |
| WO | WO 2012/135395 | 10/2012 |
| WO | WO 2013/182954 | 12/2013 |
| WO | WO 2013/182955 | 12/2013 |
| WO | WO 2014/057367 | 4/2014 |
| WO | WO 2014/068496 | 5/2014 |

OTHER PUBLICATIONS

Search report dated Sep. 17, 2013 in corresponding Italian Application No. VI2012000292.
Opinion dated Oct. 30, 2012 related to Search Report dated Sep. 17, 2013 in corresponding Italian Application No. VI2012000292.
Search report dated Sep. 23, 2013 in corresponding Italian Application No. VI20120333.
Opinion dated related to Search Report dated Sep. 23, 2013 in corresponding Italian Application No. VI20120333.
Meakin D, "Development and Qualification of Monolithically Assembled Modules for Back Contact PC Cells", $25^{th}$ European Photovoltaic Solar Energy Conference and Exhibition, Sep. 6, 2010, pp. 3858-3862.
Rosco V. et al "Systematic reliability studies of back-contact photovoltaic modules", Aug. 13, 2012, SPIE vol. 8472 84720D, pp. 1-4.
Hanita Coatings, DuraShield Back-Contact Sheets; Jun. 13, 2012; pp. 1-2.
Gee, J M. et al, "Simplified module assembly using back-contact crystalline-silicon solar cells" Sep. 30, 1997; pp. 1085-1088.

* cited by examiner

APPLICATION OF THE ENCAPSULANT TO A BACK-CONTACT BACK-SHEET

TECHNICAL FIELD OF THE INVENTION

The present invention relates to the field of photovoltaic modules. In particular, the present invention relates to an innovative assembly method of a photovoltaic module. Yet more in detail, the present invention relates to a method for fixing an encapsulating layer or a multi-layered structure to the inner surface of a back-contact back-sheet.

STATE OF THE ART

Solar cells are used for converting solar light into electrical energy by means of the photovoltaic effect. Solar cells are, thus, one of the most promising alternative energy sources for replacing fossil fuels. Solar cells are formed by semiconductive materials and are assembled so as to form the so-called photovoltaic modules, which in turn are bundled together in order to form photovoltaic systems which are typically installed on rooftops or the like.

In order to form a photovoltaic modules, groups of solar cells, grouped in series through appropriate electrical conductors called "ribbons", are usually encapsulated by means of an encapsulating material such as, for example, a blend of polyethylene (PE) with a variable quantity of vinyl acetate (VA), commonly known as EVA. The encapsulating material enclosing the solar cells is then inserted between a surface layer and a base layer or back-sheet, so as to complete the photovoltaic module. The surface layer, or main surface of the module, typically made of glass, covers the surface of the module exposed to the sun and allows the solar light to reach the cells. On the other hand, the back-sheet carries out a variety of tasks. It ensures the protection of the encapsulating material and of the solar cells from environmental agents, while simultaneously preventing the electrical connections from oxidizing. In particular, the back-sheet prevents moisture, oxygen and other atmospheric condition factors from damaging the encapsulating material, the cells and the electrical connections. The back-sheet also provides for electrical insulation for the cells and the corresponding electrical circuits. Furthermore, the back-sheet must have a high degree of opacity for aesthetic reasons and high reflectivity in the sun-facing part for functional reasons.

The electrical connection in photovoltaic modules comprising traditional solar cells occurs on both the front and the rear side of the cell. Back-contact cells are a new, more efficient and cost-effective generation of photovoltaic cells, wherein the contacts with both electrodes of the cell are transferred to the rear side of the cell, i.e. onto the side not exposed to the light radiation. A particularly efficient and easily realisable back-contact cell is the Metallization Wrap Through cell (MWT), in which the contact to the front electrode is transferred to the rear side of the back-contact cell by means of a through-hole performed across the thickness of the semiconductor substrate.

Back-contact cells pose new technological problems concerning the design and the structure of the modules adapted to accommodate them. For example, the back-sheet must be designed so as to support a connecting circuit which is brought into electrical contact with the ohmic contacts formed on the rear side of the cell. These ohmic contacts are connected to both electrodes (base and emitter). One of the solutions to this problem is the so called back-contact back-sheet, which is an evolution of the traditional back-sheet, wherein the connecting circuit is implemented directly on the surface of the back-sheet facing the cell.

Figure 1:
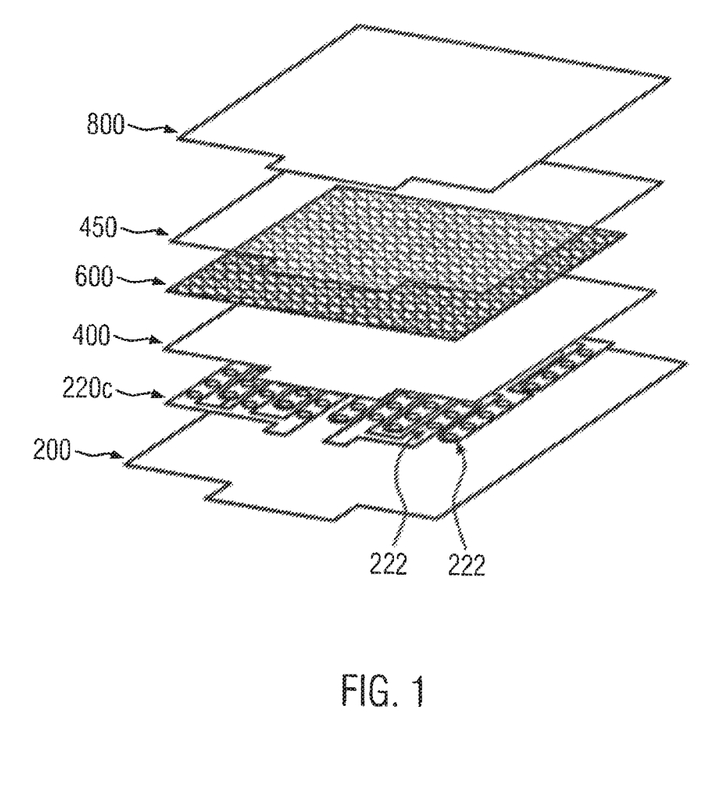
FIG. 1 shows an exploded view of a portion of a photovoltaic module comprising back-contact cells.

FIG. 1 shows the structure of a photovoltaic module comprising back-contact solar cells. Back-contact cell 600 is arranged between an upper encapsulating layer 450 and a lower encapsulating layer 400. The cell 600 and the encapsulating layers 400 and 450 are then enclosed between a protective surface layer 800 usually made of glass or of a transparent and antireflective material and the back-sheet 200, which may be a back-contact back-sheet. In FIG. 1 the paths of electrically conductive material forming the connecting circuit 220c to the electrodes of the solar cell are shown. If the back-sheet 200 is a back-contact back-sheet, the connecting circuit 220c is formed directly onto the surface of the lower-lying insulating substrate and is firmly fixed thereto. The connecting circuit 220c is used so as to ensure an electrical contact with both electrodes, i.e. with the base and the emitter, of the solar cell 600. In particular, the tracks or paths of electrically conductive material are provided with pads 222 marking the points of the connecting circuit 220c which are to be electrically connected with a contact to one of the electrodes formed on the surface of cell 600.

The back-sheet 200, the connecting circuit 220c, the lower encapsulating layer 400, the cells 600, the upper encapsulating layer 450 and the protective surface layer 800 are placed on each other so as to form a stack 100.

The procedure of assembling a photovoltaic module such as the one shown in FIG. 1 is usually performed in the manner described in the following.

The lower encapsulating layer 400 to be arranged between the cell 600 and the back-sheet or back-contact back-sheet 200 is pierced so that, after the module has been completed, the holes formed in the lower encapsulating layer 400 correspond to areas where the pads 222 for contact with the electrodes are arranged.

The pierced encapsulating layer 400 is then laid on top of the inner face of the back-sheet or back-contact back-sheet 200, i.e. onto the face of the back-sheet or back-contact back-sheet 200 facing the inside of the photovoltaic module. When applying the lower encapsulating layer 400, the encapsulating sheet is aligned to the back-sheet or back-contact back-sheet so that the holes in lower encapsulating layer 400 correspond or are aligned to the pads 222. In this way, the pads 222 are left exposed toward the inside of the photovoltaic module.

A lump or drop of an electrically conductive material is then deposited onto the pads 222 of the conductive paths of the connecting circuit 220c formed on the surface of the back-sheet or of the back-contact back-sheet 200. The surface of pads 222 is left exposed by the holes of the lower encapsulating layer 400. The conductive material deposited onto the pads 222 may, for example, comprise a conductive paste of the type knows as "Electrically Conductive Adhesive" (ECA).

Subsequently, the cells 600 to be embedded in the module are placed onto the lower encapsulating layer 400, so that each contact element with the electrodes formed on the rear surface of the cells comes into contact with a lump of conductive paste applied to one of the pads 222 and exposed to contact with the cells 600 through one of the holes of the lower encapsulating layer 400. The upper encapsulating layer 450 is then placed onto the upper surface of the cell 600, opposite to the rear surface in contact with the conductive paste applied to the pads 222. Finally, a layer 800 of a transparent and antireflective material is laid onto the upper encapsulating material layer 450, so as to protect the components of the photovoltaic module.

Once the structure has been prepared into a stack 100, as just described, it is laminated in vacuum at a temperature between 145° C. and 165° C. for a time range between 8 and 18 minutes. Before the lamination, the stack 100 of layer shown in FIG. 1 can be turned upside down so as to place the upper protective layer 800 in contact with the surface of a hot plate placed inside the lamination device.

Figure 2A:
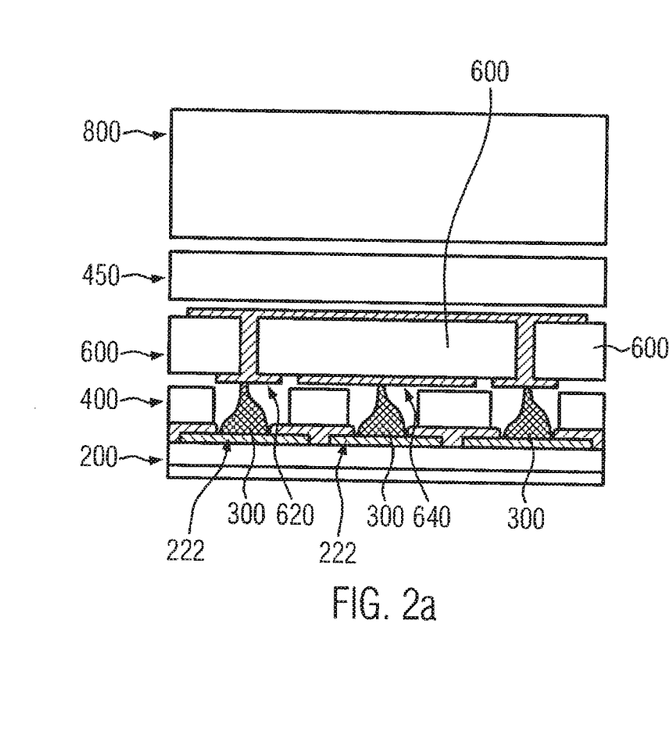
FIG. 2a shows the structure of a photovoltaic module, of the type shown in FIG. 1, before the lamination process.

FIG. 2a shows the stack 100 of the photovoltaic module before the lamination process. The components of the module, stacked as previously described, are singularly distinguishable. In particular, FIG. 2a shows a stack 100 comprising, starting from the bottom and moving towards the top of the figure, the back-sheet or back-contact back-sheet 200 with the conductive pads 222 upon which the conductive paste 300 has been applied, the lower encapsulating layer 400, the cells 600, the upper encapsulating layer 450 and the protective surface layer 800. The electrical connection to the electrodes (base and emitter) of cell 600 is secured by the contact points 620 and 640 formed on the rear side of the cell 600, i.e. on the side facing the connecting circuit 220c and the back-sheet 200. The contact points 620 and 640 can be connected to the positive and negative electrodes of the photovoltaic cell, respectively.

Figure 2B:
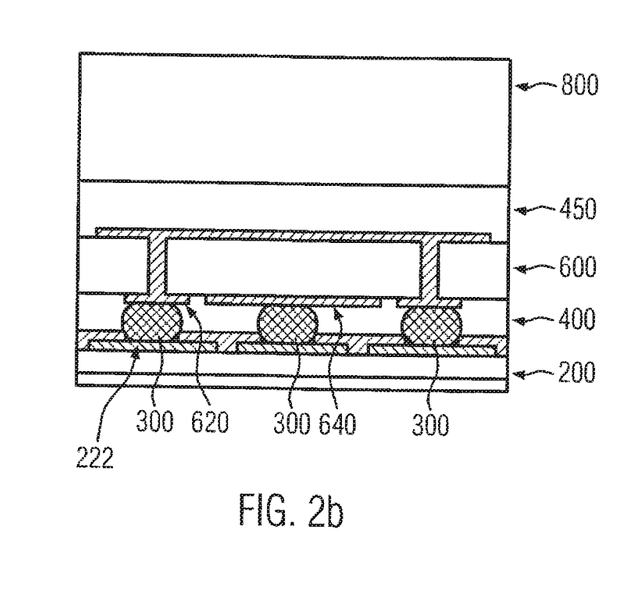
FIG. 2b shows the structure of a photovoltaic module, of the type shown in FIG. 1, after the lamination process.

FIG. 2b schematically shows the structure of the module after the lamination process has taken place. During the first phase of the lamination, the structure is arranged into a vacuum chamber from which the air is evacuated by means of pumps. Pressure is then applied to the structure so as to compact the different layers of which the photovoltaic module structure is comprised while simultaneously maintaining a vacuum in the area in which the module is situated. The whole cycle has preferably a total duration of less than 18 minutes. The cycle preferably occurs at a temperature comprised between 140° C. and 165° C.

The lamination results in the hardening of the conductive paste 300 through its polymerization, thus causing the cells 600 to attach to the back-sheet or to the back-contact back-sheet 200. Furthermore, the lamination process must also cause the melting and the subsequent polymerization of the upper and lower encapsulating layers 450 and 400. In this way, the material of at least a portion of the lower encapsulating layer 400, by melting, fills the voids between the conductive paste 300, the inner surface of the back-sheet or back-contact back-sheet 200 and the rear surface of the cells 600. Moreover, through the polymerization of at least one of the materials of which the upper encapsulating material layer 450 is made, this upper encapsulating layer exerts also an adhesive action between the surface layer 800 and outer surface of the cell 600 in contact with the upper encapsulating layer 450. In the same way, the lower encapsulating layer 400, after polymerizing, also ensures adhesion between the rear surface of the cells 600 and the back-sheet 200.

The lower encapsulating layer 400 may comprise a single sheet of encapsulating material or a multi-layered structure, whose upper layer exerts an encapsulating action and whose lower layer provides for adhesion of the structure to the inner surface of the back-contact back-sheet.

A recurring problem during the production of photovoltaic modules is the expansion or contraction of the lower encapsulating layer during the lamination process and in particular, during the initial phase of the lamination, before pressure force is applied so as to compact the different layers of the module. Due to the increasing temperature, the lower encapsulating layer expands to temperatures between 50° C. and 60° C. and then it contracts at temperatures comprised between 60° C. and the melting temperature. This causes a misalignment of the lower encapsulating material 400 with respect to the back-contact back-sheet below it and with respect to the photovoltaic cells 600 above it. In particular, due to the movements caused by thermal expansion or thermal contraction during the lamination, the through-holes in the lower encapsulating layer 400 can lose the original alignment with the contact points 222 on the connecting circuit 220c and with the ohmic contact points 620 and 640 on the lower surface of the cells 600.

This effect, which happens mainly during the first phase of the lamination, is highly undesirable, because it is very important that each contact point 222 on the connecting circuit 220c be exposed, through a corresponding through-hole in the lower encapsulating layer 400, so as to set a contact point 620 or 640 on the surface of the cell 600 into electrical contact with the contact point 222 on the connecting circuit 220c. Moreover, it is necessary that each through-hole in the lower encapsulating layer 400 be aligned with a corresponding ohmic contact 620 or 640 on the lower surface of the cells 600.

Considering the problems and the drawbacks described above, an object of the present invention is to provide a cost-effective, efficient and fast method of production of a photovoltaic module which allows avoiding or substantially reducing the problems mentioned above.

BRIEF DESCRIPTION OF THE INVENTION

The present invention is based on the new and inventive concept that the manufacturing process of a photovoltaic module can be more cost-effective, efficient and faster if an adhesion is induced, even if weak, between some portions of the lower encapsulating layer and the inner surface of the back-contact back-sheet on which the lower encapsulating layer is applied after it has been aligned. On the basis of these considerations, the method of production of a photovoltaic module, in different embodiments, is proposed.

The present invention is based also on the innovative concept that a laser beam may be used to heat predetermined portions of the lower encapsulating layer so as to induce the adhesion to the underling back-contact back-sheet. The present invention is based, moreover, on the innovative concept that infrared radiation may be used so as to induce the adhesion of the lower encapsulating layer to the inner surface of the back-contact back-sheet.

According to an embodiment of the present invention, points or predetermined portions of the lower encapsulating layer can adhere to the surface of the cells facing the lower encapsulating layer, after the components forming the photovoltaic modules have been put into a stack and before the lamination process of the stack.

This invention, that is described as applicable to a complex comprising a back-contact back-sheet and an encapsulating layer meant as a unitary element, can be applied also in the later phases of the manufacturing process that may include intermediate steps prior to the application of the encapsulating layer to the back-contact back-sheet.

Preferred embodiments of the present invention are provided by the dependent claims and by the following description.

BRIEF DESCRIPTION OF THE FIGURES

Further features and advantages of the present invention will become clearer from the following description of the embodiments of the device as shown in the figures. In the figures, identical and/or similar, and/or corresponding parts are identified by the same reference numbers or letters. In particular, in the figures.

DETAILED DESCRIPTION

In the following, the present invention will be described with reference to particular embodiments as shown in the attached figures. However, the present invention is not restricted to the particular embodiments described in the following detailed description and as shown in the figures, rather, the described embodiments merely show several aspects of the present invention whose scope is defined by the claims.

Further modifications and variations of the present invention will be clear for the person skilled in the art. As a consequence, the present description is to be considered as comprising all modifications and/or variations of the present invention, whose scope is defined by the claims.

In the following, and in the whole description, the expression "above" or "below" refers to an imaginary ground plane. The expression "point A above (below) point B" indicates that the distance of point A to the ground plane is longer (shorter) than the distance of point B to the ground plane. Analogously, reference is made to an object placed "down" ("up") as well as to an object "nearer" ("further") from the ground plane with respect to one or more objects explicitly or implicitly mentioned. As previously mentioned, the production of a back-contact back-sheet comprises the manufacturing of an insulating substrate, the application of a electrical conductive layer to the inner surface of the insulating substrate and the manufacturing of said layer of conductive material so as to form a connecting circuit in it.

The back-contact back-sheet used according to the method according to the present invention has been described in Italian Patent Applications No. VI2012A000132 and VI2012A000264.

Figure 3:
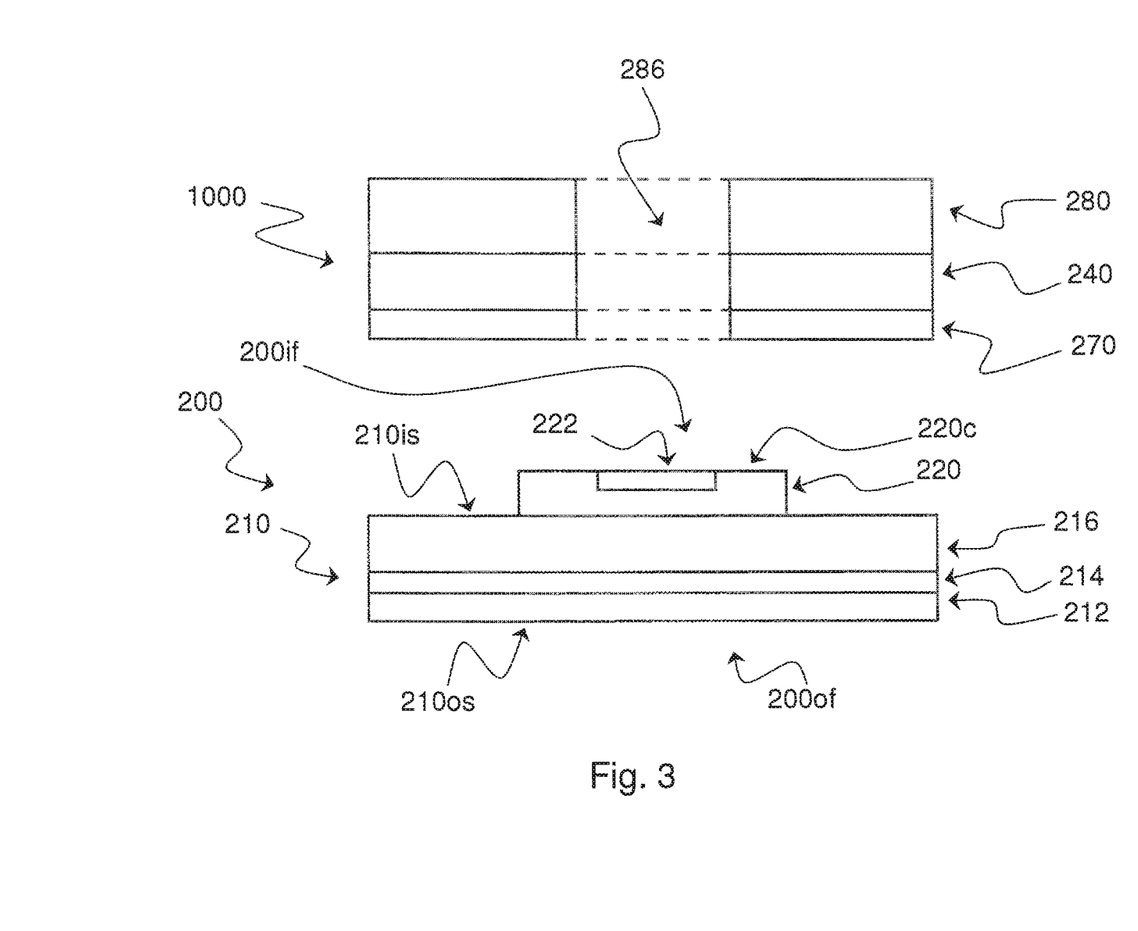
FIG. 3 shows a cross-section of a system comprising a multi-layered structure and a back-contact back-sheet before the application of the multi-layered structure to the surface of the back-contact back-sheet.
Figure 4:
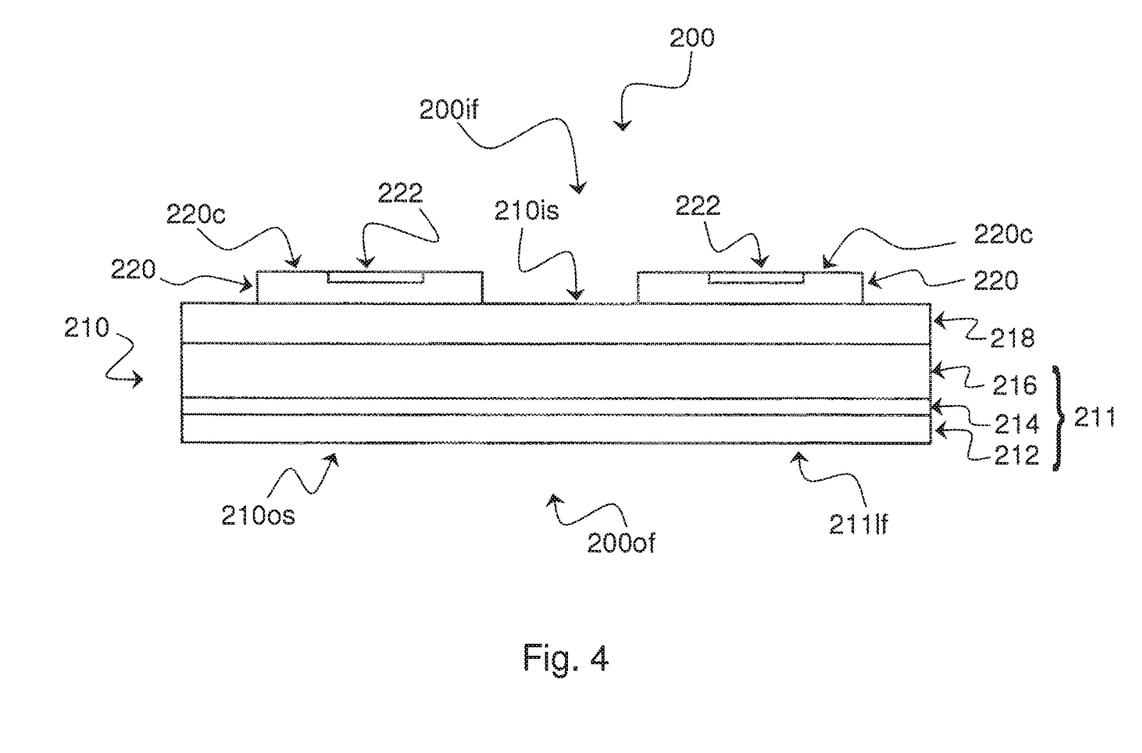
FIG. 4 shows a cross-section of a further example of a back-contact back-sheet.

In FIGS. 3 and 4, the air-side of the photovoltaic module is placed down, beyond the back-contact back-sheet 200.

With reference to FIG. 3, the back-contact back-sheet 200 comprises an outer surface 200*of* facing the air-side of the photovoltaic module and an inner surface 200*if* opposite the outer surface 200*of* and facing the inner side of the photovoltaic module.

The back-contact back-sheet 200 comprises, moreover, an insulating substrate or complex 210 facing the air-side of the photovoltaic module.

The insulating substrate 210 is manufactured so as to comprise an outer surface 210*os* facing the air-side of the photovoltaic module and substantially coincident with the outer surface 200*of* of the back-contact back-sheet 200. Moreover, the insulating substrate 210 comprises an inner surface 210*is* opposite the outer surface 210*os* and facing the inner side of the photovoltaic module.

In the embodiment of the back-contact back-sheet shown in FIG. 3, the insulating substrate 210 comprises a first insulating layer 212, an intermediate layer 214 and a second insulating layer 216.

According to the method according to the present invention, initially, the first insulating layer 212, which has a lower surface facing the air-side of the photovoltaic module and substantially coincident with the outer surface 210*os* of the substrate 210, is produced or provided. The first insulating layer 212 is used as a barrier against the moisture, UV-rays, oxygen and other external environmental agents which might penetrate into the module, thereby damaging some constituent parts thereof or deteriorating the polyurethane or polyester adhesive by changing its colour to yellow. The first insulating layer 212 may comprise a polymer such as, for example, polyvinyl chloride (PVF), polyvinyldenfluoride (PVDF), polyethylene tereflalate (PET) or other polymers. The first insulating layer 212 may, moreover, comprise other materials known from the state of the art. The first insulating layer 212 can be manufactured so as to have a thickness of approximately 25 μm-75 μm or more.

On the upper surface of the first insulating layer 212, opposite the lower surface exposed to the air-side, an intermediate layer 214 is applied, which is used as a barrier against moisture and water vapour. The intermediate layer 214 typically comprises aluminium, preferably with a thickness in the range of 8 μm and 25 μm. The intermediate layer 214 can be applied to the first insulating layer by using, for example, an adhesive.

In some embodiments the intermediate layer 214 can be omitted.

The second insulating layer 216, which works as an electrical insulator and as a further barrier, is then applied on the upper surface of the intermediate layer 214, opposite to the surface facing the first insulating layer 212. The upper surface of the second insulating layer 216, opposite to the surface facing the intermediate layer 214, substantially corresponds to the inner surface 210*is* of the insulating substrate 210. The second insulating layer 216 typically comprises a polymer such as, for example, polyethylene tereftale (PET), polyethylene (PE), polyvinyl fluoride (PVF) polyvidene fluoride (PVDF) polyethylene naftalite (PEN), polyamide (PI) or similar. The second insulating layer 216 may have a thickness between 125 μm and 350 μm or larger.

In alternative embodiments of the back-contact back-sheet not shown in the figures, the insulating substrate 210 is manufactured so as to comprise only a first insulating layer 212 and a second insulating layer 216 directly applied to the upper surface of the first insulating layer 212, without the presence of the intermediate layer 214. Moreover, it is possible to produce a back-contact back-sheet in which the insulating substrate 210 is made of a single layer comprising, for example, one or more polymers such as PET, PE, PVF, PVDF, PEN, PI, similar polymers and combinations of same.

According to a further embodiment of the method according to the present invention and schematically shown in FIG. 4, the substrate 210 of the back-contact back-sheet 200 is made so as to comprise an insulating portion 211 and a primer layer 218 applied to the insulating portion 211. The primer layer 218 and the insulating portion 211 of the substrate 210 have been previously described in the Italian Patent Application No. VI212A000264. In the following, this embodiment will be briefly outlined.

The insulating portion 211 of the substrate 210 comprises a lower surface 211*lf* facing the air-side of the photovoltaic module and substantially coincident with the outer surface 210*os* of the substrate 210 and, therefore, with the outer surface 200*of* of the back-contact back-sheet. The insulating portion 211 comprises, moreover, one upper surface opposite to the lower surface 211*lf*. The insulating portion 211 can be manufactured according to any of the different methods in which the substrate 210 is produced, according to the embodiments described above.

The primer layer 218 is applied to the upper surface of the insulating portion 211 opposite to the lower surface 211*lf*, so that the inner surface of the primer layer 218, opposite to the surface facing the insulating portion 211, substantially coincides with the inner surface 210*is* of the substrate 210. Once the back-contact back-sheet has been completed, the primer layer 218 will be placed between the lower insulating portion 211 of the substrate 210 and the layer of conductive material 220 in which the connecting circuit 220*c* has been formed.

The primer layer 218 can be deposited using an extrusion coating on the upper surface of the lower insulating portion 211 or can be fixed using an adhesive system.

The primer layer has a thickness comprised between 50 μm and 350 μm and, preferably, between 50 μm and 150 μm.

The primer layer 218 has the main function of securing a better adhesion of the inner surface 200*if* of the back-contact back-sheet with the sheets of encapsulating material 400 and 450 shown in FIG. 1 and/or with one layer of thermo-adhesive material that has to be applied thereon. The adhesion is obtained after the lamination process of the photovoltaic module previously described with reference to FIGS. 1, 2*a* and 2*b*.

Accordingly, the primer layer 218 comprises one or more materials which are "compatible" and "chemically alike" to the encapsulating or thermoplastic materials of the layer placed above the back-contact back-sheet 200. More in detail, the primer layer 218 may comprise EVA (for example EVA with an amount of vinyl-acetate comprised between 3% and 5%), linear low-density polyethylene (LLDPE), linear high-density polyethylene (LHDPE), polyolefin or a combination of same. In addition, or alternatively, the primer layer 218 may comprise one or more thermo-adhesive materials. For example, the primer layer may comprise at least one of the following thermo-adhesive materials: acrylic copolymers, or polyurethane with additives, acrylic terpolymers grafted with maleic anhydride. The primer layer 218 may comprise also a combination of two or more of the above-cited materials.

The inner surface 210*is* of the insulating layer 210 of the back-contact back-sheet is, therefore, usually made by one or more of the polymeric or thermo-adhesive materials cited above.

A layer of electrically conductive material 220 is then applied on the inner surface 210*is* of the substrate 210 opposite the outer surface 210*os* facing the air-side, so that the layer 220 is firmly fixed to the inner surface 210*is* of the insulating layer 210 facing the inner side of the photovoltaic module. The electrically conductive layer 220 may have a thickness approximately comprised between 25 μm and 70 μm. The layer of conductive material 220 comprises a metal having high electric conductibility such as, for example, copper or aluminium.

The layer of conductive material 220 is usually a continuous layer when it is applied to the inner surface 210*is* of the substrate 210 and it is later manufactured so as to form a pattern comprising, for example, elongated elements such as trails, tracks, paths, etc. This pattern forms a connecting circuit 220*c* with the electrodes of the solar cell.

The connecting circuit 220*c* can be formed in the layer of conductive material using techniques such as photolithography, dry or wet chemical etching, mechanical ablation obtained, for example, using a milling process, laser ablation and other suitable techniques known to the person skilled in the art.

The manufacturing of the layer of conductive material can be performed after the layer of conductive material 220 has been applied to the inner surface 210*is* of the insulating substrate 210. Alternatively, the connecting circuit 220*c* can be formed in the layer of conductive material prior to the application of the layer of conductive material 220 to the inner surface 210*is* of the substrate 210.

Since the connecting circuit 220*c* is formed so as to have portions of its surface comprising nooks, or meanders, the circuit 220*c* usually leaves exposed some of the portions of the inner surface 210*is* of the substrate 210 on which it is applied.

Once the circuit 220*c* has been formed in the layer of electrically conductive material 220 which is firmly fixed to the inner surface 210*is*, the inner surface 200*if* of the back-contact back-sheet, opposite the outer surface 200*of* facing the air-side, comprises the surface of the connecting circuit 220*c* facing the inner-side of the photovoltaic module and a portion of inner surface 210*is* of the substrate 210 left exposed from the connecting circuit 220*c*. In the case of the back-contact back-sheets shown in FIGS. 3 and 4, the inner surface 210*is* of the substrate 210 coincides with the surface of the second insulating layer 216 facing the inner side of the photovoltaic module and with the surface of the primer layer 218 facing the inner side of the photovoltaic module, respectively.

The conductive layer 220 comprises, moreover, pads 222 placed in predetermined position of the pattern forming the conductive circuit 220*c*. The pads 222 are placed in electrical contact with the ohmic contacts formed on the surface of the electrodes of the solar cells through a drop of electrically conductive material. The ohmic contacts are, for example, the ones indicated in FIGS. 2*a* and 2*b* with the reference numbers 620 and 640. The pads 222 ensure, therefore, the electrical contact with the solar cells applied in the photovoltaic module.

Once the conductive layer 220 has been applied to the inner surface 210*is* of the substrate 210 and once the connecting circuit 220*c* has been formed, the manufacturing of the back-contact back-sheet 200 can be considered to be complete.

The lower encapsulating layer 400 can be produced according to the method according to the present invention. The manufacturing of the lower encapsulating layer can be performed prior to, simultaneously or after the manufacturing of the back-contact back-sheet 200, since the lower encapsulating layer 400 is produced using independent and usually different machines, apparatuses and technologies than the ones with which the back-contact back-sheet is produced.

Generally, the lower encapsulating layer 400 comprises a lower surface facing the back-contact back-sheet 200. The lower encapsulating layer 400 comprises, moreover, an upper surface, opposite the lower surface and facing the inner side of the photovoltaic module. In this way, once the photovoltaic cells 600 have been placed onto the lower encapsulating layer 400, the upper surface of the lower encapsulating layer 400 face the photovoltaic cells 600.

The lower encapsulating layer 400 may comprise a single sheet of encapsulating material or a multi-layered structure 1000 schematically shown in the upper panel of FIG. 3.

The laminated structure 1000 to be fixed to the back-contact back-sheet according to the method according to the present invention, has been previously described in the Italian Patent Applications No. VI2012A000133 and VI2012A000169.

In FIG. 3, the multi-layered structure 1000 is shown during a phase of the assembly process of the photovoltaic module prior to its application to the back-contact back-sheet.

With reference to FIG. 3, the multi-layered structure 1000 composed by a lower layer 270, an intermediate layer 240 and an upper layer 280. Each layer has a specific function.

The upper layer 280 comprises an encapsulating material which is used to protect the solar cells when the photovoltaic module has been completed. During the lamination, the upper layer 280 of the multi-layered structure 1000 must be shaped to fit into the space comprised between the lower encapsulating layer 400 and the photovoltaic cells 600, so as to fill the voids between the adjacent cells 600 and between the lower encapsulating layer 400 and the upper surface of the cells 600. Moreover, the upper layer 280 must melt and has to be sufficiently fluid at the temperatures used during the lamination processes currently used during the assembly processes of the photovoltaic modules.

The upper layer 280 may comprise at least one of the following materials: EVA, silicones, inomers, thermal polyurethanes, polyolefins, thermal polyolefins and acrylic grafted terpolymers. The grafting may comprise maleic anidride. The upper layer 280 has a function similar to the single sheet of encapsulating layer.

The intermediate layer 240, placed immediately below the upper layer 280 of encapsulating material, has the function of contrasting the elasticity of the upper layer 280 and to give mechanical consistency to the structure, so that the structure 1000 does not bend due to the effect of traction tension. In this way, the following operation of piercing of the multi-layered structure 1000 is easier and more precise with respect to the piercing of a single sheet of encapsulating material. The intermediate layer 240 of the multi-layered structure 1000 may comprise a polymer such as PET, PP, PI or other polymers having a high elasticity module and having melting temperatures higher than the melting temperatures of the encapsulating material of which the upper layer 280 is made.

Finally, the lower layer 270 is responsible for the adhesion of the multi-layer structure 1000 to the inner surface 200*if* of the back-contact back-sheet on which the structure 1000 is applied. The material of which the lower layer 270 is made should ensure a good adhesion of the lower layer 270 to the surface of the layer of conductive material 220, and also to the portions of the inner surface 210*is* of the substrate 210 left exposed from the layer of conductive material 220. The material of which the lower layer 270 is made has to be such that the lower layer 270 can be shaped according to the different heights of the inner surface 200*if* of the back-contact back-sheet 200 and so as to fill up any possible void. Moreover, the lower layer 270 should melt and should be sufficiently fluid at the temperatures used in the lamination processes for the assembly processes of photovoltaic modules.

The lower layer 270 of the structure 1000 or the lower layer of encapsulating material 400 may comprise a thermoadhesive material such as a resin chosen among epoxy, phenolepox, copolyester, polyurethane or ionomeric polyurethane. Alternatively, the lower layer 270 or the lower layer of encapsulating material 400, may comprise an encapsulating material, such as one of the materials of which the upper layer 280 is made. The lower layer 270 may, therefore, comprise one of the following materials: EVA, silicones, inomers, thermal polyurethanes, polyolefins, thermal polyolefins and acrylic grafted terpolymers.

According to a possible embodiment of the multi-layered structure 1000, the upper layer 280 and the lower layer 270 comprise a grafted acrylic terpolymer with a high content of maleic anhydride, while the intermediate layer 270 comprises polypropylene. According to a further embodiment, the upper and lower layers 280 and 270 comprise EVA used as an encapsulating comprising peroxides used as additives, while the intermediate layer 240 may comprise PP or the PET.

Once the lower encapsulating layer has been manufactured in the form of a multi-layered structure 1000 or as a single sheet of encapsulating material, this lower encapsulating layer 400 can be pierced so as to realize within it, in a predetermined position, a plurality of through-holes 286. The through-holes are preferably made in correspondence of the ohmic contact points 620 and 640 at the electrodes of the photovoltaic cells placed on the rear surface of the back-contact cell 600. These ohmic contacts 620 and 640 can be formed, for example, on the positive electrode (p contact) and on the negative electrode (n contact) of the cell 600, respectively.

Thanks to the presence of the intermediate layer 240, the structure 1000 is substantially non-extendable within the limits of the intermediate layers, and this facilitates the operation of opening of the through-holes 286 in the structure 1000. The through-holes 286 can be made using punching, mechanical ablation using milling, laser ablation, laser contouring or other techniques known to the skilled person in the art.

After the realization of the back-contact back-sheet 200 and after the realization and the piercing of the lower encapsulating layer 400, the lower encapsulating layer 400 according to this embodiment is aligned and applied to the inner surface 200*if* of the back-contact back-sheet 200 previously manufactured.

The through-holes 286 of the multi-layered structure 1000 or of the single sheet of encapsulating material are pierced so that, once the multi-layered structure or the sheet of the encapsulating material have been aligned with the back-contact back-sheet, the position of each of the through-holes 286 corresponds to the position of one of the ohmic contacts 620 and 640 formed on the rear surface of the cells. Moreover, each through-hole is opened in a position such as to leave exposed a corresponding contact point 222 on the layer of conductive material 220, once the lower encapsulating layer 400 has been aligned and applied to the back-contact back-sheet. The contact points 222 in the connecting circuit 220*c* of the back-contact back-sheet 200 can, in this way, be put in electric contact through the though-holes 286 with the ohmic contacts 640 or 620 on the rear surface of the cell 600.

When the lower encapsulating layer 400, conveniently pierced, has been aligned and applied to the inner surface 200*if* of the back-contact back-sheet 200, a drop of conductive paste 300 can then be applied to the contact points 222 through each through-hole 286. Afterwards, the cell 600 is placed on the multi-layered structure 1000 or on the single sheet of encapsulating material, pierced so that the position of each contact point 620, 640 at the electrodes of the cells 600 corresponds to the position of a respective contact point 222 on the connecting circuit 220c. In this way, the contact points 620 and 640 on the lower surface of the cell 600 can be put in electrical contact with the contact points 222 in the connecting circuit 220c through the through-holes 286. The conductive paste 300 deposited on the contact points 222 though the through-holes 286 in the lower encapsulating layer 400 is responsible for the electric connection between the electrodes of the solar cells 600 and the connecting circuit 220c.

It is obvious that during this phase, a perfect alignment between contact points 222, through-holes 286 and contacts 620 or 640 of the cells is highly desirable.

As described above, once the cells 600 have been placed on the lower encapsulating layer 400, conveniently pierced, an upper encapsulating layer 450 is applied to the upper surface of the solar cell opposite to the lower surface facing the lower encapsulating layer 400.

A protective upper layer 800, typically comprising glass or another transparent and antireflective material is then applied on the upper surface of the upper encapsulating layer 450 opposite the lower surface facing the cells 600.

Once the layers forming the photovoltaic module have been stacked one on top of the other as previously described, the stack 100, shown in FIGS. 1 and 2a, is laminated at a temperature between 145° C. and 165° C. for a period of time comprised between 8 and 18 minutes.

During the lamination, the heating of the system causes the partial melting of the lower layer 270 of the multi-layered structure 1000 (FIG. 3) or of the single encapsulating sheet of the lower encapsulating layer 400 (FIGS. 1, 2a and 2b). The lower layer 270 or the single sheet of encapsulating material, melting, are responsible for the fixing of the lower encapsulating layer 400 to the back-contact back-sheet 200. Moreover, the thermo-adhesive materials or the encapsulating materials present in the lower encapsulating layer 400, penetrate, after melting, into the voids between adjacent trails of the connecting circuit 220c of the layer of conductive material 220 (see for example FIG. 2b). In this way, the lower layer 270 of the multi-layered structure 1000 or of the single layer of the lower encapsulating layer 400 have the further function as electrical insulator between adjacent but not electrically connected trails of the connecting circuit 220c. The lower layer 270 of the structure 1000 or the single sheet of the lower encapsulating layer 400 have the further function of neutralizing superficial currents that could flow on the inner surface 210is of the insulating substrate 210 on which the conductive layer 220 and a portion of the lower encapsulating layer 400 are fixed.

Figure 5:
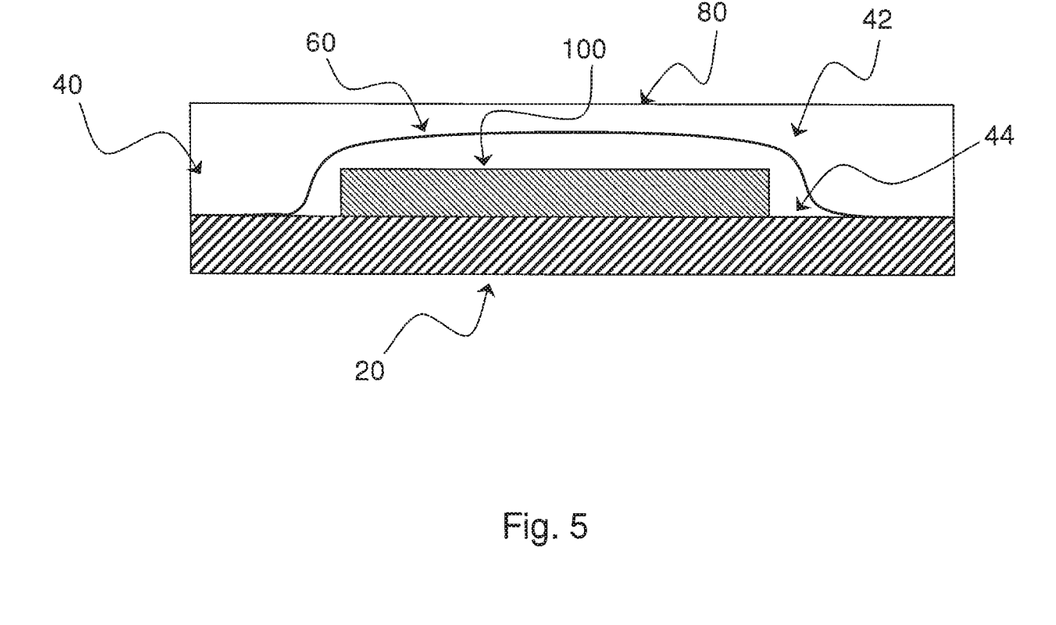
FIG. 5 schematically shows a photovoltaic module during one of the phases of the lamination process.

The lamination process is performed using an apparatus such as the one schematically shown in FIG. 5. A vacuum chamber 40 is delimited above by an air-tight cover 80, and below by a plate 20 that can be brought to the desired lamination temperature. A flexible and gas-tight membrane 60 divides the vacuum chamber into an upper chamber 42 and a lower chamber 44. Dedicated pumps allow air to be eliminated, producing vacuum, in each of the two portions 42 and 44 of the chamber 40 in an independent way one from the other. Both the upper chamber 42 and the lower chamber 44 have, moreover, dedicated valves which, once opened, allow the passage of air between the outside and the inside of each chamber.

During the preliminary phase of the lamination, the air-tight cover is opened and the stack 100 formed by the layers to be laminated, is placed on the surface of the hot plate 20. The stack 100 comprises the layers shown in FIGS. 1, 2a and 2b, i.e. the back-contact back-sheet 200, the lower encapsulating layer 400, the cells 600 with the conductive paste 300 between the lower surface of the cell 600 and the connecting circuit 220c, the upper encapsulating layer 450 and the upper protective layer 800. The plate 20 is at the lamination temperature.

It has to be considered that, while in FIGS. from 1 to 4, the stack 100 is shown with the back-contact back-sheet on the lower part, when the lamination is performed, it is more preferable that the upper protective layer 800 be in contact with the hot plate 20.

The cover 80 is then hermetically closed and the first lamination phase begins, in which the air is pumped out from both chambers 42 and 44, so as to reduce the pressure within them to a value of approximately 10-20 mmHg. The aspiration of the air from the chamber 40 is necessary to avoid that air bubbles remain trapped between the adjacent layers of the stack 100. At the end of the first lamination phase, the pressure in the upper chamber 42 is almost equal to the pressure in the lower chamber 44. In this way, the membrane 60, not subject to pressure forces, is in an equilibrium configuration, so as not to exercise any force on the stack 100. This equilibrium configuration of the membrane 60 is schematically shown in FIG. 5.

During the aspiration of the air in the lower chamber 44 and in the upper chamber 42, the plate 20 heats the module 100, causing, in this way, a melting or a softening of the lower 400 and upper 450 encapsulating layers.

During the second phase of lamination, the pressure in the upper chamber 42 is increased so as to reach a value nearer to the ambient pressure, while the pressure in the lower chamber 44 is left at the previously reached value. In this way, the pressure in the upper chamber 42, higher than the pressure in chamber 44, pushes the membrane 60 towards the module 100, on which a force, proportional to the difference between the pressure in the upper chamber 42 and the pressure in the lower chamber 44, is applied. This force holds the layers of the stack 100, compressed one against the other, avoiding, in this way, any possible lateral movement of one with respect to the others. The force exercised by the membrane 60 on the stack 100, produces also an increasing of the speed of heat transfer between the hot plate 20 and the stack 100, allowing, in this way, the polymerization of the encapsulating layers that require it. During the second phase of lamination, the plate continues to provide heat to the stack 100, promoting, in this way, the hardening of the conductive paste 300 and the melting of the lower and upper encapsulating layers 440 and 450. At the end of the second phase of lamination, the layer of the stack 100 are packed one on top of the other and the photovoltaic module is in its final assembled form. At the end of the second lamination phase, the valves of the lower chamber 44 are opened, allowing air to enter from the outside to the inside of the chamber 44. When the chamber 44 has reached the ambient pressure, the cover 80 can be opened and the assembled module 100 can be taken from the apparatus.

As illustrated above, a recurring problem during the assembly process of a photovoltaic module is that during the first lamination phase described above, the lower and the upper encapsulating layers 400 and 450 expand and contract under the effect of the temperature. Consequently, the lower encapsulating layer 400 loses its initial alignment with the back-contact back-sheet and it usually brings the cells, placed above it, in its contraction and expansion movement, in an unpredictable way. In particular, the through-holes 286 of the lower encapsulating layer 400 could lose alignment with the respective pads 222 in the connecting circuit and/or with the ohmic contacts 620 and 640 on the cells 600, because of the expansion or the contraction of the lower encapsulating layer 400. This is highly undesirable, because it is fundamental that the through-holes 286 of the lower encapsulating layer 400 remain in perfect alignment with the pads 222 of the connecting circuit 220c and with the contact points 620 and 640 on the cells during the entire lamination process of the module, so as to ensure a good electric contact between the connecting circuit 220c and the ohmic contacts 620 and 640 at the electrodes of the solar cells 600.

The encapsulating materials usually tend to deform if they are subjected to a temperature change. In particular, the typical encapsulating materials usually expand to a certain value of the temperature comprised between 50° C. and 60° C. With increasing temperature above this interval, usually the encapsulating materials contract until to temperatures near the melting temperature. The typical values of expansion are of the order of $10 \cdot 10^{-5}$ m/(m·° C.), while a typical value of contraction is of the order of $3 \cdot 10^{-4}$ m/(m·° C.).

Considering the typical dimensions of the photovoltaic module (about 1600 mm in length), a change in temperature of 60° C. theoretically would cause an expansion and a contraction of the lower encapsulating layer 400 in the width direction of, respectively, about 10 mm and about 29 mm. It is clear that the dimensions of these movements are enough to irremediably compromise the alignment of each contact 620 and 640 on the cells 600 with the respective through-holes 286 in the lower encapsulating layer 400 and the corresponding contact pads 222 on the connecting circuit 220c of the back-contact back-sheet 200.

In reality, the movements of the lower encapsulating layer 400 during the lamination are a lot smaller. This is due mainly to two factors. First of all, while the material of the lower encapsulating layer 400 heats, it starts to adhere to the surface of the layer with which it is in contact. The adhesion force between the lower encapsulating layer 400 and the surrounding surfaces reduces, in this way, the possibility of expansion and contraction of the lower encapsulating layer 400 with respect to the case in which it would be isolated and not applied to other surfaces. Moreover, the encapsulating materials have a variable elastic module depending on the temperature. In particular, the elastic module of the typical encapsulating material decreases with increasing temperature.

These two phenomena slow down and reduce the movements of the lower encapsulating layer 400 during the lamination. In particular, the adhesion to the surfaces has an important role.

Accordingly, the movement of deformation of the lower and upper encapsulating layers 400 and 450, happens mainly during the first lamination phase, when the pressure is not applied to the stack 100 of layers and the encapsulating layers are not yet melted. In fact, during the second lamination phase the movements of the encapsulating layers 400 and 450 are encumbered or, in any case, obstructed by the pressure exercised by the membrane 60 which presses and blocks the entire underlying complex 100. Moreover, the adhesion force of the encapsulating layers 400 and 450 to the surfaces adjacent to them and the reduction of the elastic module of the same encapsulating layers 400 and 450, caused by the increase of the temperature, continue to slow down the deformation movement of the encapsulating layers 400 and 450 because the temperature of the polymer continues to increase.

In order to avoid the problem related to the movement of the lower encapsulating layer during the first lamination phase, an embodiment of the present invention proposes a method of manufacturing a photovoltaic panel according to which the lower surface of the layer of the lower encapsulating material 400 is attached, at least partially, to the inner surface 200if of the back-contact back-sheet 200 before the lamination process. The adhesion of the lower encapsulating layer 400 to the inner surface 200if of the back-contact back-sheet is performed after the lower encapsulating layer 400 is applied and aligned to the back-contact back-sheet, as described above. Moreover, according to an embodiment of the present invention, the adhesion of the inner surface of the lower encapsulating layer 400 to inner surface 200if of the back-contact back-sheet is performed before the assembly of the module in which the cells 600 are applied on the upper surface of the lower encapsulating layer 400 so as to bring each ohmic contact point 620, 640 on the cell 600 in contact with a respective drop of conductive paste 300.

According to a particular embodiment of the present invention, the upper surface of the lower encapsulating layer 400 is attached, at least partially, to the lower surface of the photovoltaic cells 600, while the lower surface of the lower encapsulating 400 adheres to the back-contact back-sheet as specified above.

In this way, the adhesion of the lower encapsulating layer 400 to the inner surface 200if of the back-contact back-sheet and optionally to the lower surface of the photovoltaic cells 600, reduces the possibility of expansion and contraction of the lower encapsulating layer 400. Therefore, the method according to the present invention uses and emphasizes the phenomenon of reduction of the amplitude of the movements of the lower encapsulating layer 400 during the lamination. This phenomenon is caused by the adhesion of the lower encapsulating layer 400 to the surfaces of the adjacent components of the module with which it is in contact.

The adhesion of the lower surface of the lower encapsulating layer 400 to the back-contact back-sheet 200 before the lamination can not be induced so that the whole surface of the encapsulating layer 400 adheres to the inner surface 200if of the back-contact back-sheet. In fact, given that the adhesion process is usually executed in air prior to the lamination, there would be the risk that air bubbles would remain trapped between the lower surface of the lower encapsulating layer 400 and the inner surface 200if of the back-contact back-sheet 200, if each point of the lower surface of the lower encapsulating layer 400 were attached to the inner surface 200if of the back-contact back-sheet 200.

In order to avoid this undesirable effect, the lower surface of the lower encapsulating layer 400 must be attached only in some portions or discrete predetermined points to the inner surface 200if of the back-contact back-sheet 200. It has to be noted that with the expression "point" of a surface, we want to point out, here and in the whole description, that we refer to a portion of the surface having an area much smaller than the total area of the surface.

These one or more adhesion points have to be separate one from the other so as to allow the air passage between the lower encapsulating layer 400 and the surface with which it adheres. In particular, the passage of air must be ensured in the interface comprised between the lower surface of the lower encapsulating layer 400 and the inner surface 200if of the back-contact back-sheet 200.

Moreover, in order to further allow air to flow between the lower encapsulating layer 400 and a back-contact back-sheet 200, the superficial area of each portion of the lower surface of the lower encapsulating layer 400, which adheres to the back-contact back-sheet, must be smaller, preferably a lot smaller, with respect to the total area of the lower surface of the lower encapsulating layer 400. In this way, the discrete points of adhesion leave a continuous empty space between the lower surface of the lower encapsulating layer 400 and the inner surface 200*if* of the back-contact back-sheet, inside which air can circulate.

A selective heating in predetermined points of the lower surface of the lower encapsulating layer 400, may be used in order to induce an adhesion in discrete portions of the lower encapsulating layer 400 to the underlying back-contact back-sheet 200. This selective heating can advantageously be obtained using a laser focused and directed to the portions of the lower surface of the lower encapsulating layer 400 that must be heated. The heating of the portion on which the laser is focused is responsible for the partial melting of the encapsulating layer limited to the heated portion. In this way, the heated portion of the lower encapsulating layer 400 adheres to the portion of the inner surface 200 of the back-contact back-sheet immediately below it.

The laser to be used to obtain heating in predetermined and separate portions of the lower encapsulating layer 400 has preferably a wavelength in the near infrared. In particular, the laser may have a wavelength comprised between 800 nm and 3000 nm. Preferably, the power of the laser beam is comprised between 60 W and 150 W. In general, the power of the laser varies according to the thickness of the polymeric layers used in photovoltaic module. Usually, higher power values are required for higher thicknesses and vice versa. Preferably, the transversal section of the laser ray, at distance from the source equal to the focal distance, has an area comprised between 2 mm$^2$ and 10 mm$^2$.

The laser heating has the advantage that the discrete points to be heated and that must adhere to the back-contact back-sheet, can be predetermined in a selective way focusing the laser in the previously chosen points. For example, points to be heated of the surface of the lower encapsulating layer 400 placed above the portion of the inner surface 200*if* of the back-contact back-sheet occupied by the connecting circuit 220*c*, can be chosen. Alternatively, points to be heated placed above the portion of the inner surface 200*if* given by the portion of the inner surface 210*is* of the substrate 210 left exposed from the connecting circuit 220*c* can be chosen.

Advantageously, adhesion can be induced between predetermined points of the lower surface of the encapsulating layer 400 and respective portions of the inner surface 200*if* of the back-contact back-sheet comprising a polymeric material. In fact, a local heating of the connecting circuit 220*c* could bring to a thermo-deformation of the metallic material of which the connecting circuit 220*c* is made. Moreover, the localized heating of the connecting circuit 220*c* could compromise the characteristics of the surface of the connecting circuit 220*c*, for example, by causing oxidation.

In order to induce the melting in separate portions of the lower encapsulating layer 400 after its application and after its alignment to the back-contact back-sheet and before the lamination, also a heating produced by an infrared (IR) lamp may be used. This IR radiation has to be well controlled in power, time of application and focusing, in order to avoid the formation of areas in which an air bubble could become trapped.

Instead of heating the lower encapsulating layer 400 after the alignment to the back-contact back-sheet, the lower encapsulating layer 400 can be fixed in its aligned position to the back-contact back-sheet using an adhesive system. For example, a bi-adhesive placed between the lower surface of the lower encapsulating layer 400 and the inner surface 200*if* of the back-contact back-sheet may be used. The adhesive can be applied to separate portions of the lower surface of the lower encapsulating layer 400, so as to induce the adhesion of the lower encapsulating layer 400 to the back-contact back-sheet only in the discrete points in which the adhesive is applied. In this way, the passage of air is possible between the lower surface of the lower encapsulating layer 400 and the inner surface 200*if* of the back-contact back-sheet even after the lower encapsulating layer 400 has been fixed to the back-contact back-sheet 200.

According to the method according to the present invention, therefore, the lower encapsulating layer 400 is applied to the lower surface 200*if* of the back-contact back-sheet 200 aligning it so that each through-hole 286 in the lower encapsulating layer 400 corresponds to a contact pad 222 in the connecting circuit 220*c*. The present invention proposes, therefore, to induce an adhesion between predetermined portions of the lower surface of the lower encapsulating 400 to the inner surface 200*if* of the back-contact back-sheet, so that one or a plurality of discrete and separate points of the lower surface of the lower encapsulating layer 400 are fixed to the inner surface 200*if* of the back-contact back-sheet.

The method according to the present invention, therefore, allows fixing the lower encapsulating layer 400 in the position in which it is correctly aligned to the underlying back-contact back-sheet 200, before the lamination process. Moreover, since the adhesion of the lower encapsulating layer 400 to the inner surface of the back-contact back-sheet is preferably performed before the completion of the stack of layers 100 with the cells 600, the upper encapsulating layers 450 and the upper protective layer 800, then the method according to the present invention ensures that the lower encapsulating layer 400 is fixed, even if weakly, to the back-contact back-sheet in the correct aligned position, thus avoiding that the later assembly steps of the photovoltaic module could compromise the initial correct alignment.

The method according to the present invention has also the advantage of providing a considerable reduction of the movements of expansion and/or contraction of the lower encapsulating layer during the lamination. Consequently, the lower encapsulating layer 400 maintains the correct position also during the lamination, avoiding, in particular, the risk of a possible misalignment of the through-holes 286 of the lower encapsulating layer 400 with the contact pads 222 in the connecting circuit 220*c* and/or with the contact points 620, 640 on the lower surface of the cells 600.

The method of production of a photovoltaic module according to the present invention continues in the conventional way already described, after the adhesion of one or more predetermined portions of the lower surface of the lower encapsulating layer 400 to the inner surface 210*if* of the back-contact back-sheet 200 has been performed as described above. In particular, the stack 100 of layers shown in FIGS. 1 and 2*a* is completed depositing the conductive paste 300 in the pads 222 through the through-holes 286, placing the cells 600 above the lower encapsulating layer 400, applying the upper encapsulating layer 450 on the cells 600 and closing the stack 100 with the upper protective layer 800.

According to an embodiment of the present invention, once the stack 100 of layers has been completed and before the lamination, a point or a plurality of predetermined separate and discrete points of the upper layer of the lower encapsulating layer 400 can be attached to the lower surface of the cells 600. This further limits the expansion and contraction movements of the lower encapsulating layer 400 during the lamination.

In order to avoid the formation of air bubbles trapped between the lower encapsulating layer 400 and the cells 600, it is necessary that the upper surface of the lower encapsulating layer 400 adhere to the lower surface of the photovoltaic cells 600, namely the surface of the cells 600 on which the ohmic contacts 620 and 640 to the electrodes are present, only in specific portions or discrete predetermined points, analogously to what previously described regarding the adhesion of the lower encapsulating layer 400 to the inner surface 200*if* of the back-contact back-sheet 200. In this way, the discrete points of adhesion leave a continuous empty space between the upper surface of the lower encapsulating layer 400 and the lower surface of the cells 600, inside which air can flow. According to a particular embodiment, a laser may be used in order to perform the adhesion of the predetermined points of the upper surface of the lower encapsulating layer to the cells 600. For example, the same laser or a device similar to the one used for the selective heating of the predetermined points of the lower layer of the lower encapsulating layer 400 may be used, so as to induce the adhesion of the inner surface 200*if* of the back-contact back-sheet 200.

In particular, the laser beam can penetrate inside the stack 100 from the upper protective layer 800. In this way, the laser beam follows a path which goes through the upper protective layer 800, passes or interacts with the upper encapsulating layer 450 and is therefore directed in the inter-space between two adjacent cells 600. The laser beam can, therefore, be focalized in a position corresponding to a portion of the upper surface of the lower encapsulating layer 400. In this way, a point or a portion of the upper surface of the lower encapsulating layer 400 near one of the cells 600 partially melt because of the heat produced by the laser, causing, in this way, the adhesion of the point or the portion heated by the laser to the lower surface of the cell 600, i.e. the face of the cell 600 facing the lower encapsulating layer 400.

Moreover, after the stack 100 has been completed and before the lamination, a laser may be used in order to induce a further adhesion of predetermined points of the lower surface of the lower encapsulating layer 400 to the inner surface 200*if* of the back-contact back-sheet 200. In this case, an apparatus may be used similar to the one already described, with reference to the embodiment in which a partial adhesion is induced between the upper surface of the lower encapsulating layer 400 and the lower surface of the cells 600. The laser follows the same track described in the previous embodiment but it is focalized in correspondence of the lower surface of the encapsulating layer 400.

Once the stack 100 made by the components of the module is competed, it is laminated as described above. The stack 100 can be turned upside down before the lamination, so as to place the superficial protective layer 800 in contact with the hot plate 20 of the lamination device.

It is important to understand that the idea and the method of production of the fixing between the encapsulating layer and the back-contact back-sheet and the cells, are valid even if the steps are performed in a different order. This means that the fixing can be performed on the complex comprising the back-contact back-sheet and the lower encapsulating layer before the other components of the photovoltaic module are added by the producer. In this way, the producer of the photovoltaic module can separately receive the back-contact back-sheet and the lower encapsulating layer and can then proceed with fixing these two components in the initial phase of the assembly. The producer of photovoltaic modules can perform the fixing of the lower encapsulating layer in the final phases of the assembly, after the cells have been placed and after the upper encapsulating layer has been applied.

The present invention has therefore the advantage of avoiding movement of the lower encapsulating layer 400 during the lamination and, in particular, during the first phase of the lamination. These movements are particularly undesirable in the assembly process of a photovoltaic module because they cause the misalignments of the through-holes 286 in the lower encapsulating layer 400 with the conductive pads 222 of the connecting circuit 220*c* and with the contact points 620 and 640 on the lower surface of the photovoltaic cells 400.

In order to avoid or to sensibly reduce the expansion and/or contraction of the lower encapsulating layer 400, the same is fixed in one or more separate points to the back-contact back-sheet after it has been aligned to the back-contact back-sheet and before the lamination process. In this way, the air passage between the lower encapsulating layer and the inner surface 200*if* of the back-contact back-sheet is allowed, avoiding, in this way, that air bubbles remain trapped between the lower encapsulating layer 400 and the back-contact back-sheet 200, during the lamination.

Although the present invention has been described with reference to the embodiments described above, it is clear for the skilled person that several modifications, variations and improvements of the present invention may be made, in view of the teaching described above and within the scope of the appended claims, without departing from the object and the scope of protection of the invention.

Moreover, those aspects which are deemed to be known by skilled person have not been described in order to not unduly obfuscate the described invention. Consequently, the invention is not limited by the embodiments described above but it is only limited by the scope of protection of the appended claims.

The invention claimed is:

1. Method for producing a photovoltaic module comprising back-contact cells, said method comprising the steps of:
   providing a back-contact back-sheet comprising an outer surface facing the air-side of the photovoltaic module and an inner surface opposite said outer face and exposed to the inside of said photovoltaic module,
   providing a lower encapsulating layer,
   aligning and applying said lower encapsulating layer to said inner surface of said back-contact back-sheet, said lower encapsulating layer comprising a lower surface facing said inner surface of said back-contact back-sheet and an upper surface opposite said lower surface,
   causing adhesion of one or more predetermined portions of said lower surface of said lower encapsulating layer to said back-contact back-sheet, each of said one or more predetermined portions of said lower encapsulating layer adhering to a respective portion of said inner surface of said back-contact back-sheet, each of said one or more predetermined portions having a surface area less than the total surface area of said lower surface of said lower encapsulating layer,
   applying one or more back-contact photovoltaic cells onto said upper surface of said lower encapsulating layer,
   said step of causing said adhesion of said one or more predetermined portions of said lower surface of said lower encapsulating layer being performed after said step of applying said lower encapsulating layer to said back-contact back-sheet,
   wherein said step of causing said adhesion of said one or more predetermined portions of said lower surface of said lower encapsulating layer is performed before said step of applying one or more back-contact photovoltaic cells onto said upper surface of said lower encapsulating layer.

2. A method for producing a photovoltaic module comprising back-contact cells, said method comprising the steps of:
providing a back-contact back-sheet comprising an outer surface facing the air-side of the photovoltaic module and an inner surface opposite said outer face and exposed to the inside of said photovoltaic module,
providing a lower encapsulating layer,
aligning and applying said lower encapsulating layer to said inner surface of said back-contact back-sheet, said lower encapsulating layer comprising a lower surface facing said inner surface of said back-contact back-sheet and an upper surface opposite said lower surface,
causing adhesion of one or more predetermined portions of said lower surface of said lower encapsulating layer to said back-contact back-sheet, each of said one or more predetermined portions of said lower encapsulating layer adhering to a respective portion of said inner surface of said back-contact back-sheet, each of said one or more predetermined portions having a surface area less than the total surface area of said lower surface of said lower encapsulating layer,
applying one or more back-contact photovoltaic cells onto said upper surface of said lower encapsulating layer,
said step of causing said adhesion of said one or more predetermined portions of said lower surface of said lower encapsulating layer being performed after said step of applying said lower encapsulating layer to said back-contact back-sheet,
wherein said step of causing said adhesion of said one or more predetermined portions of said lower surface of said lower encapsulating layer is performed before said step of applying one or more back-contact photovoltaic cells onto said upper surface of said lower encapsulating layer; and
wherein said predetermined portions of said lower surface of said lower encapsulating layer are isolated from each other, so as to leave a continuous empty space between said lower encapsulating layer and said inner surface of said back-contact back-sheet.

3. Method according to claim 1, wherein said adhesion of said one or more predetermined portions of said lower surface of said lower encapsulating layer is performed by means of heating or by applying an adhesive to said one or more predetermined portions.

4. Method according to claim 3, wherein said heating comprises selectively heating said one or more predetermined portions of said lower surface of said lower encapsulating layer, said selective heating being preferably performed by using a laser beam or an infrared ray lamp.

5. Method according to claim 1, wherein said step of making said back-contact back-sheet comprises:
providing a substrate having an outer surface exposed to the air-side of said photovoltaic module and coincident with said outer surface of said back-contact back-sheet and an inner surface opposite said outer surface and exposed to the inside of said photovoltaic module;
applying to said substrate a layer of electrically conductive material adapted to be formed as a connecting circuit to the electrodes of said solar cells, said application to said substrate of said electrically conductive material being performed in such a way that said layer of electrically conductive material fixedly adheres to said inner surface of said substrate, said application of said layer of electrically conductive material being performed in such a way that, after said connecting circuit has been formed in said layer of electrically conductive material, said inner face of said back-contact back-sheet comprises the surface of said connecting circuit exposed toward the inside of said photovoltaic module and the portion of said inner surface of said substrate left exposed by said connecting circuit.

6. Method according to claim 5, wherein said step of providing said substrate comprises:
providing a first insulating layer of a first polymeric material having a lower surface facing the air-side of said photovoltaic module and an upper surface opposite said lower surface,
coupling an intermediate layer of a material impermeable to water vapour to said upper surface of said first insulating layer, said intermediate layer having a lower surface facing said first insulating layer and an upper surface opposite said lower surface,
coupling a second insulating layer of a second polymeric material to said upper surface of said intermediate layer.

7. Method according claim 5, wherein said substrate comprises at least one of the following materials: polyvinyl fluoride (PVF), polyethylene (PE), polyvinylidene fluoride (PVDF), polyethylene terephthalate (PET), polyethylene naphtalate (PEN).

8. Method according to claim 5, wherein said step of providing said substrate comprises:
providing an insulating portion comprising a lower surface facing the air-side of the photovoltaic module and substantially coincident with said outer surface of said substrate and an upper surface opposite said lower surface,
coupling a primer layer to said upper surface of said insulating portion, said primer layer comprising a lower surface facing said upper surface of said insulating portion and an upper surface opposite said lower surface of said primer layer and substantially coincident with said inner surface of said substrate.

9. Method according to claim 8, wherein said primer layer comprises at least one of the following materials: EVA, polyolefins, linear low density polyethylene (LLDPE), linear high density polyethylene (LHDPE), a thermo-adhesive material such as, for example, acryl copolymers or polyurethanes loaded with additives, acryl terpolymers grafted with maleic anhydride, or combinations of the previous materials.

10. Method according to claim 5, further comprising a step of processing said layer of electrically conductive material so as to form said connecting circuit, said step of processing said layer of electrically conductive material being preferably performed after said step of applying said layer of electrically conductive material to said substrate.

11. Method according to claim 1, wherein said step of providing said lower encapsulating layer comprises providing a multi-layered structure, said multi-layered structure comprising a lower layer, an intermediate layer and an upper layer.

12. Method according to claim 11, wherein said upper layer of said multi-layered structure comprises at least one of the following materials: EVA, silicones, ionomers, thermal polyurethanes, polyolefins, thermal polyolefins, thermal adhesives in general, terpolymers grafted with maleic anhydride; or wherein said intermediate layer of said multi-layered structure comprises at least one of the following materials: polyethylene terephthalate (PET), polypropylene (PP), polyimide (PI), polyethylene naphthalate (PEN); or wherein said lower layer of said multi-layered structure comprises at least one of the following materials: EVA, silicones, ionomers, thermal polyurethanes, polyolefins, thermal polyolefins, thermal adhesives in general, terpolymers grafted with maleic anhydride, thermosetting or thermoplastic resins.

13. Method according to claim 1 further comprising the step of piercing a plurality of through-holes in predetermined positions of said lower encapsulating layer, said step of piercing said plurality of through-holes in said lower encapsulating layer being performed before said step of aligning and applying said lower encapsulating layer to said inner surface of said back-contact back-sheet.

14. Method according to claim 5
wherein said step of applying said one or more photovoltaic cells is performed in such a way that said one or more photovoltaic cells are electrically connected to said connecting circuit of said back-contact back-sheet;
and further comprising the steps of:
applying an upper encapsulating layer onto the surface of the photovoltaic cells opposite the surface facing said lower encapsulating layer;
applying an outer protective layer to the surface of said upper encapsulating layer opposite the surface facing said photovoltaic cells;
said method producing a stack of components of said photovoltaic module comprising said back-contact back-sheet, said lower encapsulating layer, said photovoltaic cells, said upper encapsulating layer, said outer protective layer.

15. Method according to claim 14 further comprising a step of heating said lower encapsulating layer performed so as to cause adhesion of one or more predetermined portions of said lower encapsulating layer to said photovoltaic cells, each one of said one or more predetermined portions adhering to a respective portion of the surface of said photovoltaic cells facing said lower encapsulating layer, said step of heating being performed after said stack of components of said photovoltaic module has been completed.

16. Method according to claim 14, wherein said stack of components of said photovoltaic module is laminated in order to obtain said photovoltaic module in its final assembled form.

17. Method according to claim 16, wherein said adhesion of said one or more predetermined portions of said lower surface of said lower encapsulating layer is performed before said lamination of said stack of components.

18. A method of making a photovoltaic cell assembly comprising the steps of:
forming a back contact back sheet having an insulating substrate with a connecting circuit and pads formed thereon;
forming through holes in a lower encapsulating layer;
placing the lower encapsulating layer with the through holes over the connecting circuit and pads of the back contact back sheet;
aligning the through holes in the lower encapsulating layer with the pads of the connecting circuit;
adhering the lower encapsulating layer to said back contact back sheet at selected points, whereby the passage of air is permitted between the lower encapsulating layer and the back contact back sheet;
placing photovoltaic cells having contact points over the lower encapsulating layer;
aligning the contact points with the through holes in the lower encapsulating layer;
making an electrical connection between the contact points and the pads;
placing an upper encapsulating layer over the photovoltaic cells; and
laminating the back contact back sheet, lower encapsulating layer, photovoltaic cells, and upper encapsulating layer together,
whereby misalignment of the back contact back sheet, through holes, and connecting circuits and pads is prevented during said step of laminating.

* * * * *